United States Patent [19]
Liu et al.

[11] Patent Number: 5,828,077
[45] Date of Patent: Oct. 27, 1998

[54] LONG-PERIOD SUPERLATTICE RESONANT TUNNELING TRANSISTOR

[75] Inventors: Wen-Chau Liu; Shiou-Ying Cheng, both of Tainan, Taiwan

[73] Assignee: National Science Council, Taipei, Taiwan

[21] Appl. No.: 965,659

[22] Filed: Nov. 6, 1997

[30] Foreign Application Priority Data

Aug. 27, 1997 [TW] Taiwan .................................. 86112304

[51] Int. Cl.$^6$ .......................... H01L 29/15; H01L 29/732
[52] U.S. Cl. ............................................. 257/25; 257/197
[58] Field of Search .............................. 257/25, 197, 198

[56] References Cited

U.S. PATENT DOCUMENTS

| | | | |
|---|---|---|---|
| 4,926,232 | 5/1990 | Ando et al. | 257/25 |
| 5,389,804 | 2/1995 | Yokoyama et al. | 257/197 |
| 5,459,331 | 10/1995 | Izumi | 257/17 |
| 5,705,825 | 1/1998 | Ando | 257/25 |

*Primary Examiner*—John Guay
*Attorney, Agent, or Firm*—Townsend and Townsend and Crew LLP

[57] ABSTRACT

A new high-speed resonant tunneling device, namely, a long-period superlattice resonant tunneling transistor, is developed according to the invention. The structure of the proposed 20-period superlattice resonant tunneling transistor consists of an InP substrate, a buffer layer formed by GaInAs material on the substrate, a collector layer formed by GaInAs material on the buffer layer, a base layer formed by GaInAs material on the collector layer, an emitter layer formed by GaInAs material on the base, a 20-period superlattice resonant tunneling layer formed by AlInAs and GaInAs materials on the emitter layer, and an ohmic contact layer formed by GaInAs material on the 20-period superlattice resonant tunneling layer. Furthermore, the emitter region includes a 20-period AlInAs/GaInAs superlattice and an emitter layer. Due to the presence of an emitter-base homojunction, collector-emitter offset voltage ($V_{CE,offset}$) can be reduced significantly. In addition, the valence band discontinuity ($\Delta Ev$) at the AlInAs/InGaAs heterojunction may be used as a barrier for holes injected from the base toward the emitter region. Therefore, the emitter injection efficiency and current gain can be increased. From the theoretical analysis and computer simulation, two subbands are observed in the superlattice region. Under the proper applied bias, the studied device will create n-type negative differential resistance (NDR). Consequently, the proposed device shows good promise for use in amplification, parity generator, and multiple-value logic circuit applications.

9 Claims, 4 Drawing Sheets

LONG-PERIOD SUPERLATTICE RESONANT TUNNELING TRANSISTOR

BACKGROUND OF THE INVENTION

1. Field of the Invention

The invention relates to a resonant tunneling transistor, and in particular to a long-period superlattice resonant tunneling transistor.

2. Description of Prior Art

Recently, the research and development of III-V Group resonant tunneling transistors has mostly focused on double-barrier resonant tunneling transistors. Even though double-barrier resonant tunneling transistors have higher peak to valley current density (Jp) and are easily manufactured, they have the disadvantages of lower peak to valley ratio (Jp/Jv) and higher offset voltage.

SUMMARY OF THE INVENTION

In view of the above, the object of the invention is to provide a long-period superlattice resonant tunneling transistor in which the confinement layer of a traditional heterojunction transistor is replaced with GaInAs/AlInAs superlattice which serves as a confinement barrier for minority carriers and a tunneling region for injected electrons, in an emitter region. Through strict design, this device has higher current gain and lower offset voltage. Furthermore, this device creates an n-type negative differential resistance with multi-stable states. Therefore, it has much higher potential for such applications as frequency dividers, parity generators, and multiple-value logic circuits.

BRIEF DESCRIPTION OF THE DRAWINGS

The present invention will become more fully understood from the detailed description given hereinbelow and the accompanying drawings, which are provided for purpose of illustrating preferred embodiments only and should not be construed as limiting the scope of the present invention, and wherein.

DETAILED DESCRIPTION OF THE INVENTION

Figure 1:
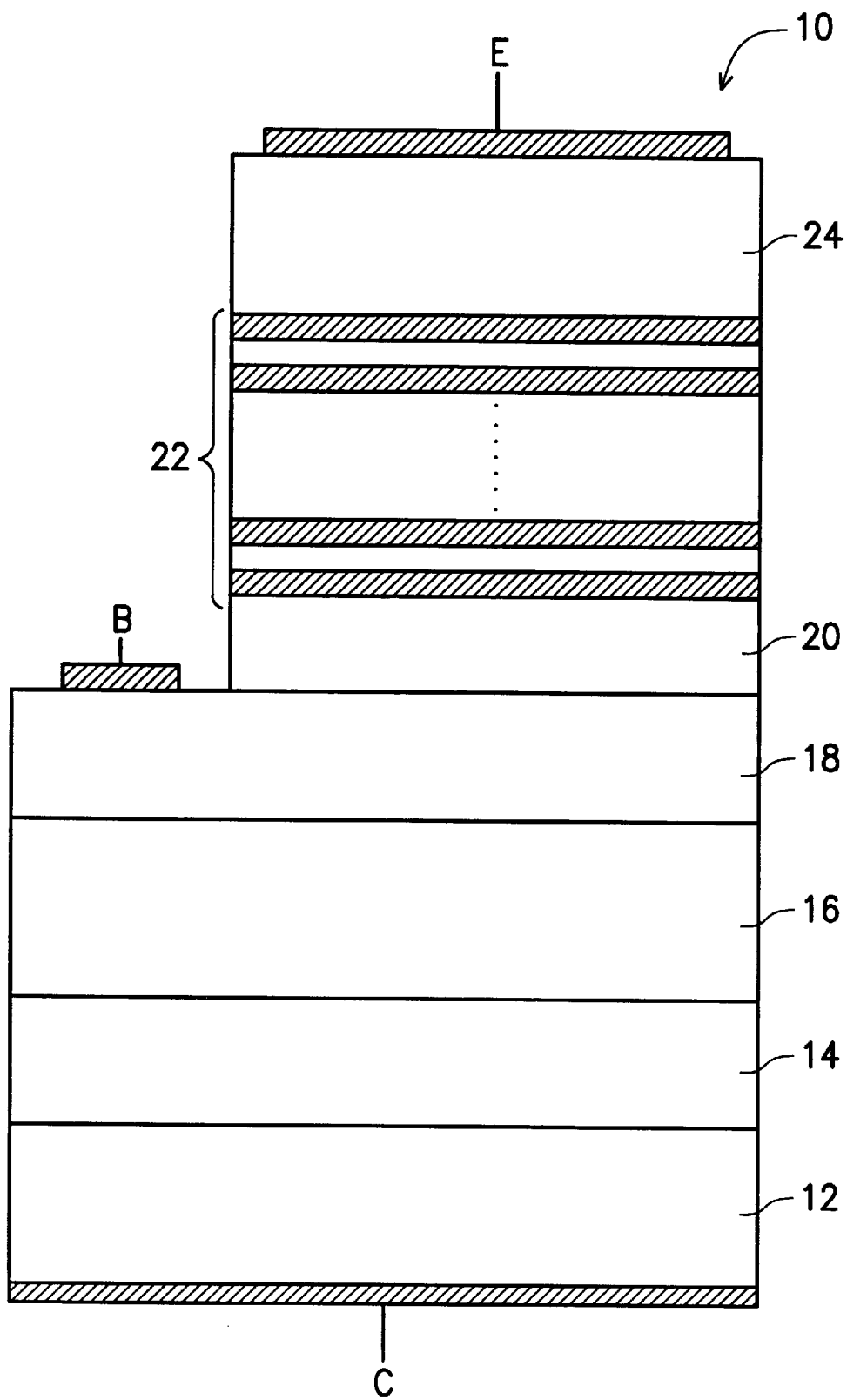
FIG. 1 is a schematic view illustrating a 20-period GaInAs/AlInAs superlattice resonant tunneling transistor.

Referring to FIG. 1, a structure of a 20-period GaInAs/AlInAs superlattice resonant tunneling is shown, which from the bottom to the top includes an n$^+$-type InP substrate 12, an n$^+$-type GaInAs buffer layer 14 with a thickness of 0.2 $\mu$m and a concentration of $3\times10^{18}$ cm$^{-3}$, an n$^+$-type of GaInAs collector layer 16 with a thickness of 0.5 $\mu$m and a concentration of $5\times10^{16}$ cm$^{-3}$, a p$^+$-type GaInAs base layer 18 with a thickness of 0.1 $\mu$m and a concentration of $1\times10^{19}$ cm$^{-3}$, an n$^+$-type GaInAs emitter layer 20 with a thickness of 500 Å and a concentration of $5\times10^{17}$ cm$^{-3}$, a 20-period GaInAs/AlInAs superlattice resonant tunneling layer 22 (each AsInAs layer with a thickness of 50 Å and without dopant, and each n$^+$-type GaInAs layer with a thickness of 50 Å and a concentration of $5\times10^{17}$ cm$^{-3}$), and an n$^+$-type GaInAs ohmic contact layer 24 with a thickness of 0.3 $\mu$m and a concentration of $5\times10^{18}$ cm$^{-3}$. Furthermore, contact metals are formed on the predetermined positions of the substrate 12, base layer 18 and ohmic contact layer 24, respectively. The ohmic contact material for the emitter and collector can be AuGeNi alloy while the ohmic contact material for the base can be AuZn alloy.

As shown in FIG. 1, the emitter region according to the invention comprises a 20-period GaInAs/AlInAs superlattice resonant tunneling layer 22 and a GaInAs emitter layer 20. Since the discontinuity $\Delta E_v$ of the valence band on a GaInAs/AlInAs heterojunction is approximately 0.25 eV, holes injected from the base to emitter with better confinement effect can increase emitter efficiency under normal operation. Moreover, since the emitter-base is a homojunction, and the emitter layer is designed with a thickness of 500 Å, such that the discontinuity ($\Delta E_v \cong 0.5$ eV) of the valence band on the AlInAs/GaInAs heterojunction is eliminated to decrease potential barrier peak, the offset voltage of the collector-emitter is expected to be much lower than that of conventional heterojunction bipolar transistors. According to resonant tunneling theory, the greater the number of periods, the less the effective width of resonant tunneling subbands, such that the peak to valley current ratio (Ip/Iv) is increased, thereby enhancing the range of applications for such devices due to the negative differential resistance.

Figure 2:
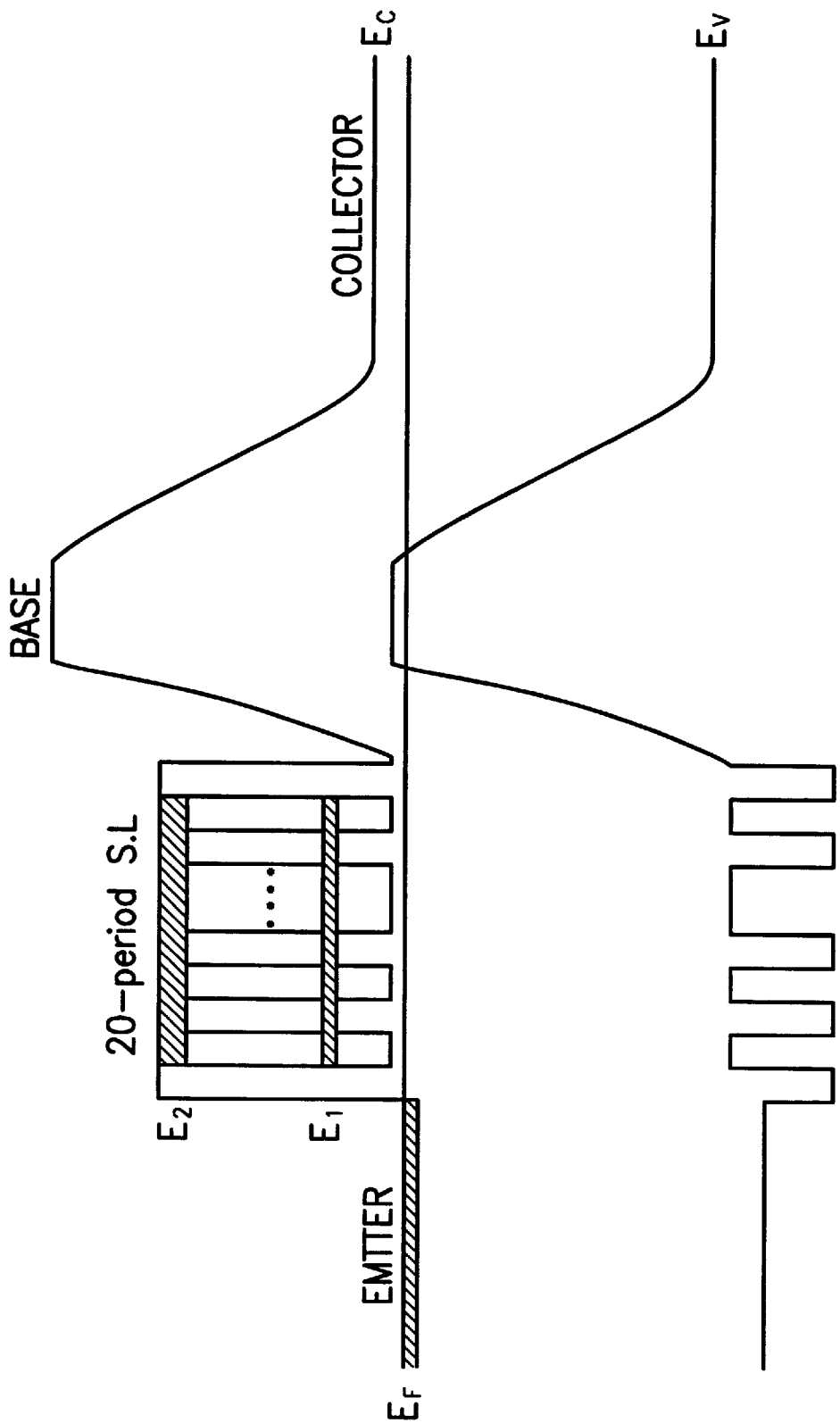
FIG. 2 is a band diagram of a 20-period GaInAs/AlInAs superlattice resonant tunneling transistor at heat balance.
Figure 3:
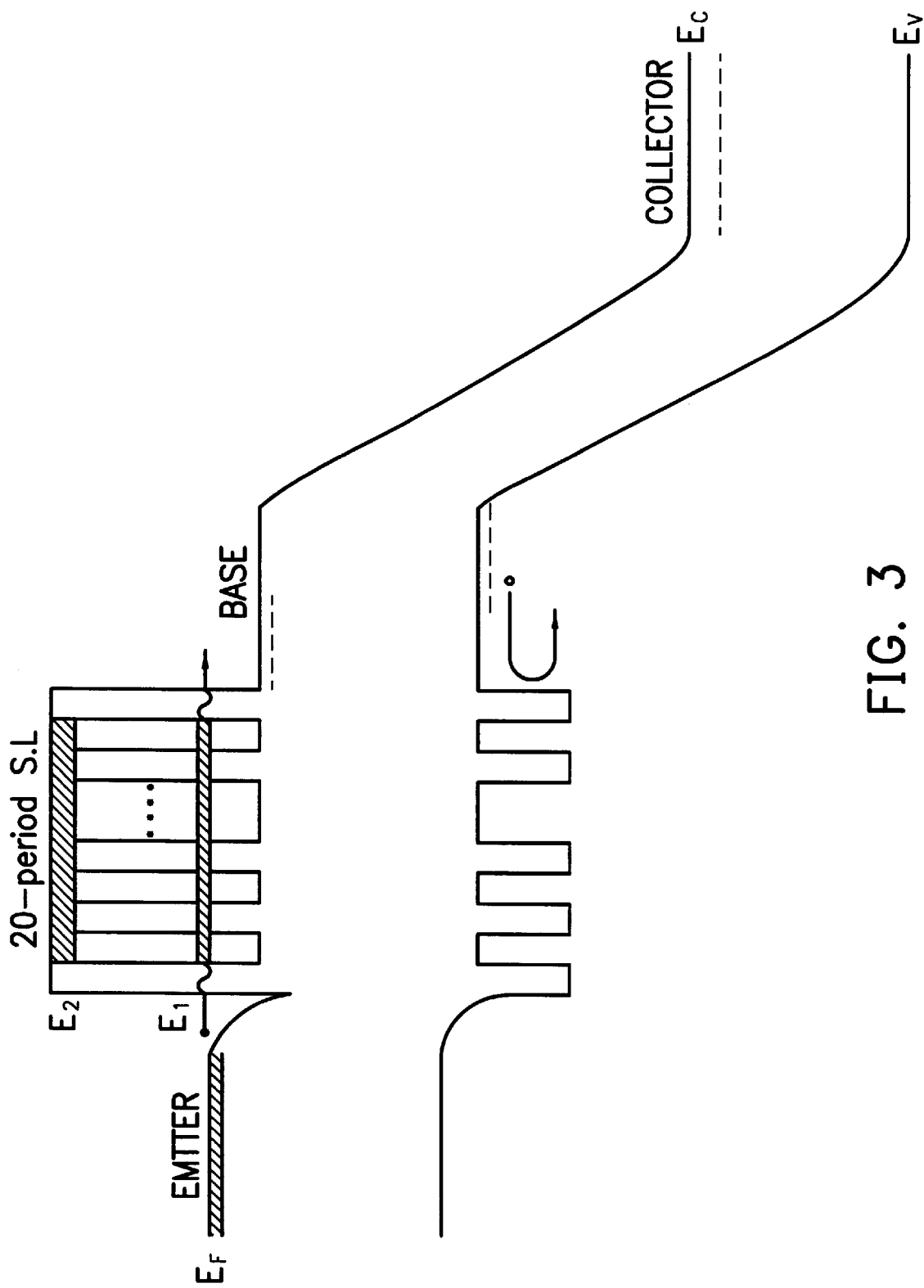
FIG. 3 is a band diagram of a 20-period GaInAs/AlInAs superlattice resonant tunneling transistor during resonant tunneling.

Referring to FIG. 2, a band diagram of a 20-period GaInAs/AlInAs superlattice resonant tunneling transistor during heat balance is shown. Two subbands are located at E1 (123 meV) and E2 (480 meV) respectively, in a superlattice region, according to transfer matrix theory, wherein $E_c$ and $E_v$ represent the lowest level and highest level of conductive band. FIG. 3 is a band diagram of a 20-period GaInAs/AlInAs superlattice resonant tunneling transistor during resonant tunneling.

Figure 4:
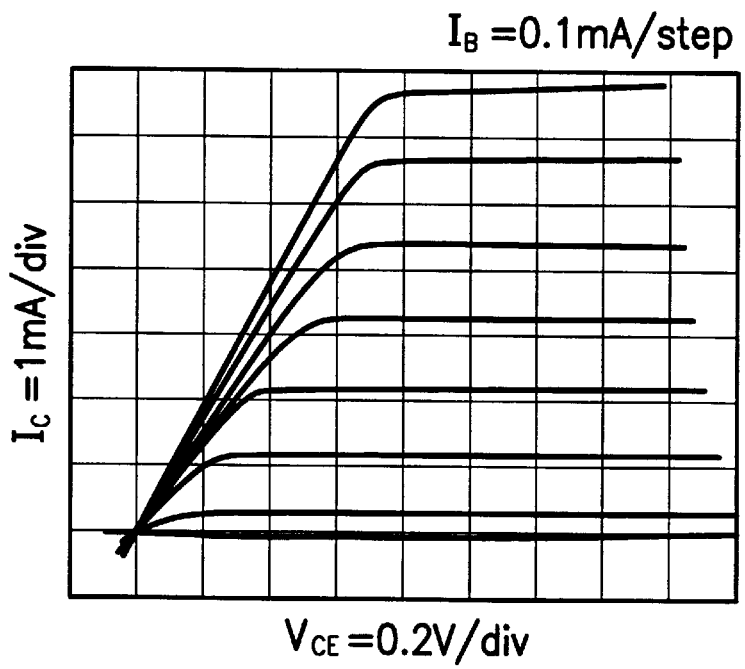
FIG. 4 is an output characteristic curve graph of a 20-period GaInAs/AlInAs superlattice resonant tunneling transistor at a room temperature.
Figure 5:
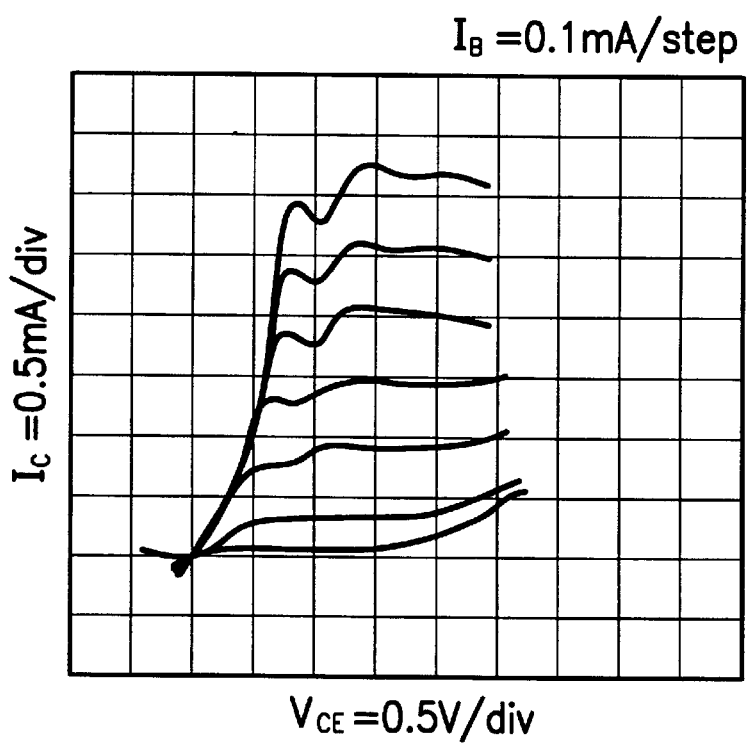
FIG. 5 is an output characteristic curve diagram of a 20-period GaInAs/AlInAs superlattice resonant tunneling at a temperature of 77 K.

In addition, FIG. 4 is a common-emitter current-voltage characteristic curve graph of the 20-period GaInAs/AlInAs superlattice resonant tunneling transistor with an emitter area of 120×120 $\mu$m$^2$ at room temperature. FIG. 5 is a common-emitter current-voltage characteristic curve graph illustrating the 20-period GaInAs/AlInAs superlattice resonant tunneling transistor with an emitter area of 120×120 $\mu$m$^2$ at a temperature of 77 K, from which negative differential resistance can be readily observed.

When the base current is relatively small, $V_{BE}$ is less than the built-in voltage of the p-n junction. At this point, the base current gradually increases, that is, the $V_{BE}$ continuously increases until a flat band appears at the emitter-base junction. In this condition, the devices according to the invention function similarly to general transistors. As the $V_{BE}$ becomes much higher, the Fermi energy level $E_F$ of the emitter region is raised. As the $V_{BE}$ continuously increases, the Fermi energy level $E_F$ and the subband of the superlattice region are out of alignment, the resonant tunneling probability is reduced, and tunneling current ceases to flow. Therefore, an n-type negative differential resistance (NDR) is present in the current-voltage characteristic curve.

The difference from conventional resonant transistors is that the n-type negative differential resistance phenomenon of the devices according to the invention can appear on multi-I-V curves. In other words, the devices according to the invention have a 3-terminal control type of NDR phenomenon (including base current), thus greatly increasing the range of the applications and potential. Since these devices form multi-I/O signals at one time without the need to adjust the working voltage, they can be applied to oscillation or timing IC devices. Furthermore, these devices according to the invention display novelty and inventive step due to their emitter multi-input function. These devices also have utility because they can be used for 2-control circuits. Moreover, the transistors and NDR characteristics can be further effectively improved through appropriate adjustment of related parameters, such as the number of period, concentration, thickness.

Although the invention has been disclosed in terms of a preferred embodiment, the disclosure is not intended to limit the invention. Those knowledgeable in the art can make modifications within the scope and spirit of the invention which is determined by the appended claims below.

What is claimed is:

1. A structure of a long-period GaInAs/AlInAs superlattice resonant tunneling transistor, comprising:

a substrate formed by InP material;

a buffer layer consisting of $Ga_{0.47}In_{0.53}As$ material on said substrate;

a collector layer consisting of $Ga_{0.47}In_{0.53}As$ material on said buffer layer;

a base layer consisting of $Ga_{0.47}In_{0.53}As$ material on said collect layer;

an emitter layer consisting of $Ga_{0.47}In_{0.53}As$ material on said base layer;

a 20-period superlattice tunneling layer formed on said emitter layer, wherein a barrier layer of said 20-period superlattice tunneling layer consists of $Al_{0.48}In_{0.52}As$ material and a quantum well layer consists of $Ga_{0.47}In_{0.53}As$ material; and an ohmic contact layer consisting of $Ga_{0.47}In_{0.53}As$ material on said 20-period superlattice tunneling layer.

2. A structure as claimed in claim 1, wherein said substrate consists of $n^+$-type InP material.

3. A structure as claimed in claim 1, wherein said buffer layer consists of $n^+$-type $Ga_{0.47}In_{0.53}As$ material with a thickness of 2,000 Å and a concentration of $3 \times 10^{18}$ cm$^{-3}$.

4. A structure as claimed in claim 1, wherein said collector layer consists of $Ga_{0.47}In_{0.53}As$ material with a thickness of 5,000 Å and a concentration of $5 \times 10^{16}$ cm$^{-3}$.

5. A structure as claimed in claim 1, wherein said base layer consists of $Ga_{0.47}In_{0.53}As$ material with a thickness of 1,000 Å and a concentration of $1 \times 10^{19}$ cm$^{-3}$.

6. A structure as claimed in claim 1, wherein said emitter layer consists of $Ga_{0.47}In_{0.53}As$ material with a thickness of 500 Å and with a concentration of $5 \times 10^{17}$ cm$^{-3}$.

7. A structure as claimed in claim 1, wherein said barrier layer in said superlattice consists of $Al_{0.48}In_{0.52}As$ material without dopant and has a thickness of 50 Å.

8. A structure as claimed in claim 1, wherein said quantum well layer in said superlattice consists of $Ga_{0.47}In_{0.53}As$ material with a thickness 50 Å and with a concentration $5 \times 10^{17}$ cm$^{-3}$.

9. A structure as claimed in claim 1, wherein said ohmic contact layer consists of $Ga_{0.47}In_{0.53}As$ material with a thickness of 3,000 Å and a concentration of $5 \times 10^{18}$ cm$^{-3}$.

* * * * *